(12) United States Patent
Katagiri et al.

(10) Patent No.: US 12,379,815 B1
(45) Date of Patent: *Aug. 5, 2025

(54) TOUCH SENSOR, TOUCH PANEL, AND IMAGE DISPLAY DEVICE

(71) Applicant: FUJIFILM Corporation, Tokyo (JP)

(72) Inventors: Kensuke Katagiri, Kanagawa (JP); Tianhua Ouyang, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/911,924

(22) Filed: Oct. 10, 2024

(30) Foreign Application Priority Data

Feb. 29, 2024 (JP) .................................. 2024-030002
May 29, 2024 (JP) .................................. 2024-087034

(51) Int. Cl.
*G06F 3/044* (2006.01)
*H10K 59/40* (2023.01)

(52) U.S. Cl.
CPC ........... *G06F 3/0446* (2019.05); *H10K 59/40* (2023.02)

(58) Field of Classification Search
CPC ......... B32B 7/023; G02B 5/22; G06F 3/0446; H10K 59/40
See application file for complete search history.

(56) References Cited

U.S. PATENT DOCUMENTS

| | | | | |
|---|---|---|---|---|
| 8,384,691 B2* | 2/2013 | Frey | ...................... | G06F 3/0445 |
| | | | | 178/18.05 |
| 9,790,126 B2* | 10/2017 | Matsuyuki | ............ | G06F 3/0445 |
| 10,089,516 B2* | 10/2018 | Popovich | ............. | G02B 6/0026 |
| 10,936,126 B2* | 3/2021 | Lee | ........................ | G06F 3/0446 |
| 2007/0139397 A1* | 6/2007 | Cross | ...................... | G06F 3/042 |
| | | | | 345/175 |
| 2014/0152579 A1* | 6/2014 | Frey | ...................... | G06F 3/0416 |
| | | | | 345/173 |

(Continued)

FOREIGN PATENT DOCUMENTS

| | | |
|---|---|---|
| JP | 2017-182285 A | 10/2017 |
| JP | 2021-121925 A | 8/2021 |

(Continued)

OTHER PUBLICATIONS

Notification for Refusal issued by the Japanese Patent Office on Jul. 30, 2024 in connection with Japanese Patent Application No. 2024-092961.

*Primary Examiner* — Amy Onyekaba
(74) *Attorney, Agent, or Firm* — Edwards Neils LLC; Jean C. Edwards, Esq.

(57) ABSTRACT

A touch sensor that is excellent in contrast between black display and white display and is excellent in performance of suppressing a decrease in brightness of white display when the touch sensor is applied to an image display device and black and white display is made, as well as an image display device including the touch sensor. The touch sensor includes a substrate and a sensing electrode disposed on at least one surface side of the substrate. The substrate includes a visible light absorber, and the substrate has an internal absorbance $A_1$ of 0.03 or less and a parameter X of 30 m$^{-1}$ or more, the internal absorbance $A_1$ and the parameter X being calculated with Test X.

14 Claims, 2 Drawing Sheets

(56) References Cited

U.S. PATENT DOCUMENTS

| | | | |
|---|---|---|---|
| 2015/0248182 A1* | 9/2015 | Hsu | G06F 3/041 |
| | | | 428/408 |
| 2015/0317020 A1 | 11/2015 | Watanabe et al. | |
| 2016/0019019 A1 | 1/2016 | Ikeda et al. | |
| 2016/0124557 A1* | 5/2016 | Choi | G06F 3/0412 |
| | | | 345/173 |
| 2016/0252785 A1* | 9/2016 | Kimura | G02F 1/133512 |
| | | | 349/12 |
| 2016/0320885 A1* | 11/2016 | Kim | G06F 3/0445 |
| 2016/0328080 A1 | 11/2016 | Miyake | |
| 2016/0364043 A1* | 12/2016 | Hwang | G06F 3/041 |
| 2017/0351362 A1* | 12/2017 | Nukui | G06F 3/0445 |
| 2018/0136749 A1* | 5/2018 | Chu | G06F 3/041 |
| 2020/0212347 A1* | 7/2020 | Park | H10K 59/80515 |
| 2022/0164066 A1* | 5/2022 | Chu | H10K 59/60 |
| 2023/0045827 A1* | 2/2023 | Yoo | G06F 3/03545 |
| 2023/0354640 A1* | 11/2023 | Nie | H10K 50/865 |
| 2024/0176454 A1* | 5/2024 | Hasegawa | G06F 3/041 |

FOREIGN PATENT DOCUMENTS

| | | | |
|---|---|---|---|
| JP | 7128319 | B2 | 8/2022 |
| JP | 7130827 | B2 | 9/2022 |

\* cited by examiner

TOUCH SENSOR, TOUCH PANEL, AND IMAGE DISPLAY DEVICE

CROSS-REFERENCE TO RELATED APPLICATIONS

The present application claims priority under 35 U.S.C. § 119 to Japanese Patent Application No. 2024-030002 filed on Feb. 29, 2024 and Japanese Patent Application No. 2024-087034 filed on May 29, 2024. Each of the above applications is hereby expressly incorporated by reference, in its entirety, into the present application.

BACKGROUND OF THE INVENTION

The present invention relates to a touch sensor that senses a touch operation, touch panel and an image display device.

Conventionally, in various electronic devices including portable information devices such as tablet computers and smartphones, a touch sensor that senses a so-called touch operation in which a finger or a stylus pen is brought into contact with or close to a screen is used. Such a touch sensor is usually formed on a surface of a substrate and includes a sensing electrode that senses a touch operation.

For example, JP 2017-182285 A discloses: a conductive film including a substrate and a conductor wire provided on at least one surface of the substrate, in which the conductor wire includes a metal layer and a visibility suppression layer, and the visibility suppression layer includes a transparent layer, a chromium-containing layer, and a transparent layer in this order; and a touch panel.

SUMMARY OF THE INVENTION

There have been increasing examples in which an image display element appealing with high contrast is used in an image display device formed by laminating a touch sensor on the image display element in recent years. The present inventors have intensively conducted studies on display performance of an image display device including a touch sensor with reference to a technique disclosed in JP 2017-182285 A, and resultantly found that when black and white display in which white and black are simultaneously displayed is made, the brightness of a black display portion adjacent to a white display portion tends to increase and the contrast tends to decrease, as compared with an image display device not including a touch sensor.

In view of the above circumstances, an object of the present invention is to provide a touch sensor that is excellent in contrast between black display and white display and is excellent in performance of suppressing a decrease in brightness of white display when the touch sensor is applied to an image display device and black and white display is made. Another object of the present invention is to provide an image display device including the touch sensor.

The present inventors have made intensive studies to solve the above problem, and as a result, have completed the present invention. That is, the present inventors have found that the above problem is solved by the following configuration.

[1]

A touch sensor comprising: a substrate; and a sensing electrode disposed on at least one surface side of the substrate, wherein the substrate includes a visible light absorber, and the substrate has an internal absorbance $A_1$ of 0.03 or less and a parameter X of 30 $m^{-1}$ or more, the internal absorbance $A_1$ and the parameter X being calculated with Test X to be described below.

[2]

The touch sensor according to [1], wherein the substrate has a thickness of 110 μm or less.

[3]

The touch sensor according to [1] or [2], wherein the visible light absorber is a black pigment, and a content of the black pigment is 10 to 500 mass ppm with respect to a total mass of the substrate.

[4]

The touch sensor according to any one of [1] to [3], wherein the substrate has a thickness of 110 μm or less, the visible light absorber is a black pigment, and a content of the black pigment is 10 to 500 mass ppm with respect to a total mass of the substrate.

[5]

A touch panel comprising the touch sensor according to any one of [1] to [4].

[6]

An image display device comprising: an image display element; and the touch sensor according to any one of [1] to [4].

[7]

The image display device according to [6] further comprising a pressure sensitive adhesive layer, wherein the image display element, the pressure sensitive adhesive layer, and the touch sensor are disposed in this order.

[8]

The image display device according to [6] or [7], wherein the image display element is an organic electroluminescence display element.

According to the present invention, it is possible to provide a touch sensor that is excellent in contrast between black display and white display and is excellent in performance of suppressing a decrease in brightness of white display when the touch sensor is applied to an image display device and black and white display is made. Further, according to the present invention, it is possible to provide an image display device including the touch sensor.

DESCRIPTION OF THE PREFERRED EMBODIMENTS

Figure 1:
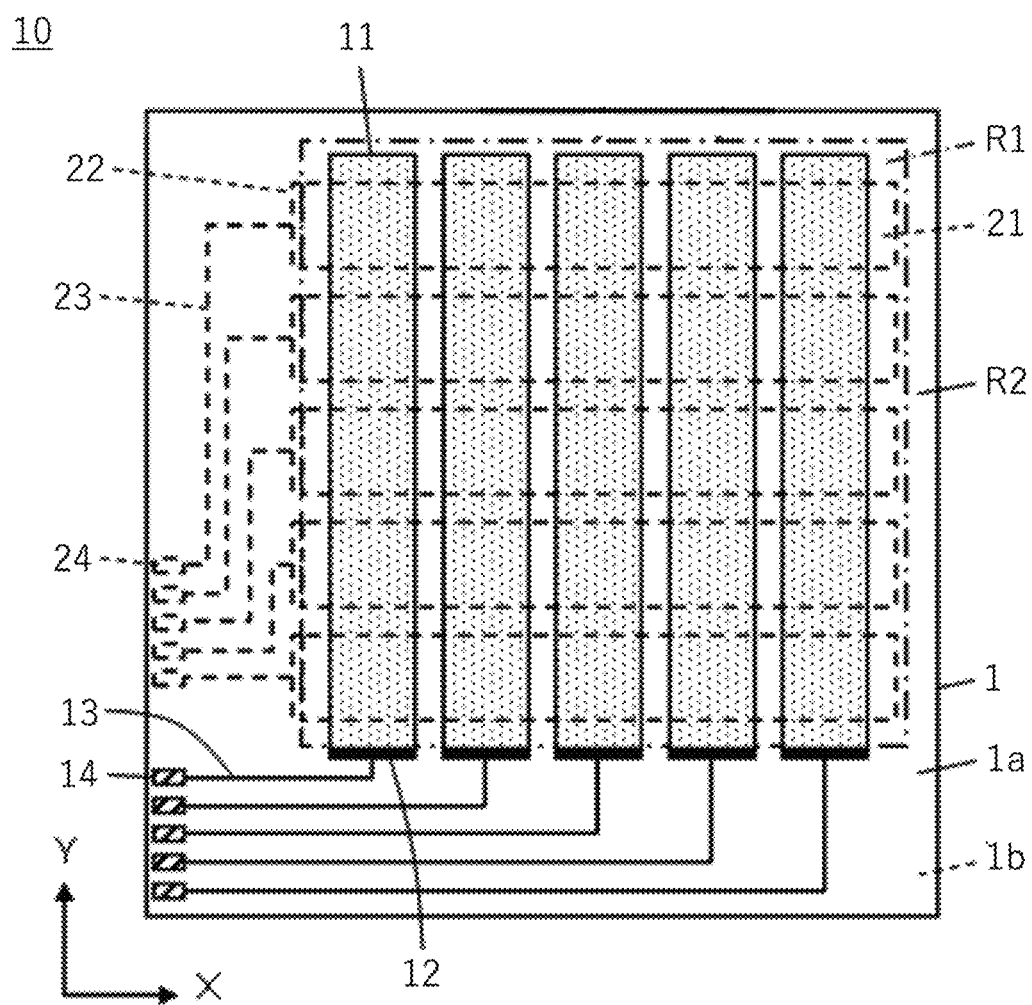
FIG. 1 is a plan view schematically illustrating an example of a touch sensor of the present invention.

Hereinafter, a touch sensor and an image display device of the present invention are described in detail with reference to the drawings.

The description of the configuration requirements described below is made based on representative embodiments of the present invention, and the present invention is not limited only to such embodiments. In addition, each drawing is provided as an example to describe the present invention, and the scale of each component may be changed from the actual scale in order to facilitate visual recognition or description.

In the present specification, a numerical range represented using "to" means a range including numerical values described before and after "to" as a lower limit and an upper limit.

In the present specification, when a component includes two or more types, the "content" of the component means the total content of the two or more types.

As to the angle, "orthogonal" or "vertical" means a range of 90°±5°, and "parallel" means a range of 0°±5°. Similarly, an angle represented by a specific numerical value means that a difference from an exact angle is within 5° unless otherwise specified. The difference between the exact angle and the above orthogonal, vertical, or parallel, or the above angle is preferably 4° or less, and more preferably 3° or less.

The "polymer" means a compound having a weight average molecular weight of 2,000 or more. The weight average molecular weight herein is defined as a polystyrene equivalent value measured under the following conditions using gel permeation chromatography (GPC).

Apparatus: HLC-8320GPC manufactured by TOSOH CORPORATION

Column: TSK-GEL G3000PWXL manufactured by TOSOH CORPORATION

Column temperature: 35° C.

Flow rate: 0.5 mL/min

Calibration curve: POLY SODIUM ACRYLATE STANDARD made by Sowa Science Corporation Eluent: a solution prepared by diluting a mixture of sodium dihydrogen phosphate 12-hydrate/disodium hydrogen phosphate dihydrate (34.5 g/46.2 g) to 5,000 g with pure water The "main surface" means a surface having the largest area in a film-like, sheet-like, or plate-like member.

The "visible light" means light in a wavelength range of 380 to 780 nm.

The "transparent" means that the light transmittance in the wavelength range of visible light is 40% or more, preferably 60% or more, more preferably 80% or more, and still more preferably 90% or more. The light transmittance is measured according to "Plastics-Determination of total luminous transmittance and reflectance" defined in JIS K 7375:2008 using a known transmittance measuring device.

In the present specification, the "acrylic resin" is used to mean one or both of a polymer and a copolymer containing a unit derived from at least one monomer selected from the group consisting of an acrylate monomer and a methacrylate monomer.

[Touch Sensor]

The touch sensor of the present invention includes a substrate and a sensing electrode disposed on at least one surface side of the substrate.

Hereinafter, the touch sensor of the present invention is described in detail with reference to the drawings.

FIG. 1 is a plan view schematically illustrating an example of a configuration of the touch sensor of the present invention.

A touch sensor 10 includes a substrate 1, sensing electrodes 11 disposed on one surface 1a of the substrate 1, and sensing electrodes 21 disposed on the other surface 1b of the substrate 1.

In the drawing, the plural sensing electrodes 11 all extend along Y direction on the surface 1a of the substrate 1. The plural sensing electrodes 11 are arranged at intervals from each other in X direction orthogonal to Y direction. The surface 1a of the substrate 1 is further provided with plural electrode connection terminals 12 formed at one ends of the plural sensing electrodes 11 separately, plural peripheral wires 13 electrically connected to the plural electrode connection terminals 12 separately, and plural external connection terminals 14 electrically connected to the plural peripheral wires 13 separately. The plural external connection terminals 14 are used for electrically connecting to an external device (not illustrated). One end of each of the plural peripheral wires 13 is coupled to the corresponding electrode connection terminal 12, and the other end is coupled to the external connection terminal 14.

The plural sensing electrodes 21 all extend along X direction on the surface 1b of the substrate 1. The plural sensing electrodes 21 are arranged at intervals from each other in Y direction. The surface 1b of the substrate 1 is further provided with plural electrode connection terminals 22 electrically connected to one ends of the plural sensing electrodes 21 separately, plural peripheral wires 23 electrically connected to the plural electrode connection terminals 22 separately, and plural external connection terminals 24 electrically connected to the plural peripheral wires 23 separately. The plural external connection terminals 24 are used for electrically connecting to an external device (not illustrated). One end of each of the plural peripheral wires 23 is coupled to the corresponding electrode connection terminal 22, and the other end is coupled to the external connection terminal 24.

The sensing electrodes 11 and 21 function as sensor electrodes for sensing a so-called touch operation, and are formed of plural conductive thin wires, as described later.

In the touch sensor 10 illustrated in FIG. 1, a sensing region R1 is a region surrounding the sensing electrodes 11 and 21 disposed on the surfaces of the substrate 1. A peripheral region R2 is a region outside the sensing region R1 (i.e., on a peripheral edge side), and the peripheral wires 13 are disposed in the peripheral region R2.

Figure 2:
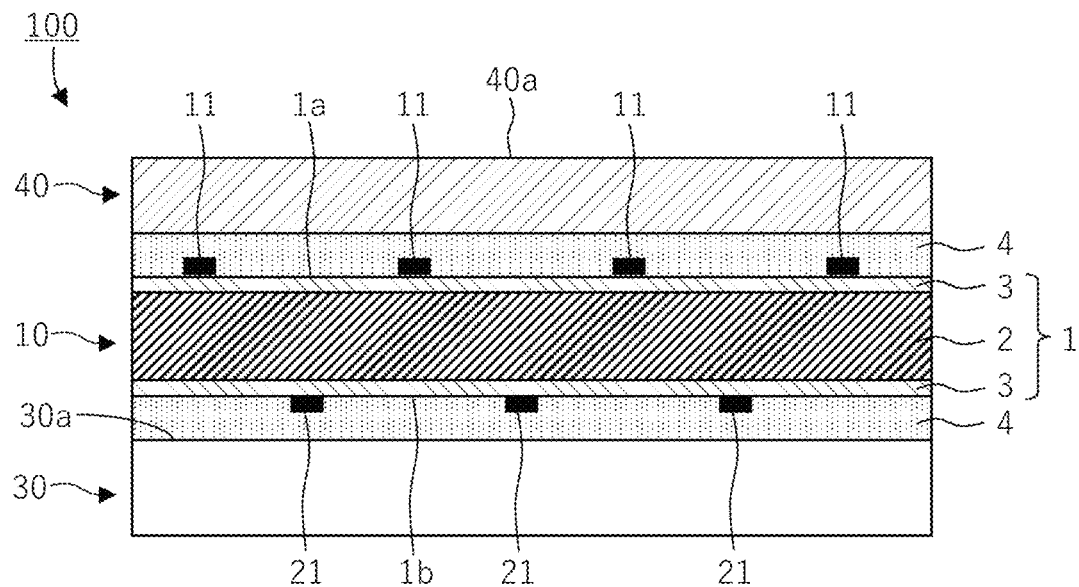
FIG. 2 is a cross-sectional view schematically illustrating an example of an image display device including the touch sensor of the present invention.

FIG. 2 is a schematic cross-sectional view illustrating an example of an image display device including the touch sensor of the present invention.

In an image display device 100 illustrated in FIG. 2, an image display element 30, the touch sensor 10 of the present invention, and a protective layer 40 are laminated in this order in a lamination direction.

In the image display device 100, an image (not illustrated) displayed on a display surface 30a of the image display element 30 is visually recognized through the touch sensor 10 and the protective layer 40. A surface 40a of the protective layer 40 on the side opposite to the touch sensor 10 is a touch surface of the image display device 100 and serves as an operation surface.

As described above, the touch sensor 10 includes the substrate 1, the sensing electrodes 11 disposed on the one surface 1a of the substrate 1, and the sensing electrodes 21 disposed on the other surface 1b of the substrate 1.

The substrate 1 shown in FIG. 2 has a multilayer structure including a support 2 and undercoat layers 3 disposed on both surfaces of the support 2. The touch sensor 10 also includes a pressure sensitive adhesive layer 4 disposed on the one surface 1a of the substrate 1 so as to cover the sensing electrodes 11, and a pressure sensitive adhesive layer 4 disposed on the other surface 1b of the substrate 1 so as to cover the sensing electrodes 21.

The touch sensor of the present invention is a touch sensor including a substrate and a sensing electrode disposed on at least one surface side of the substrate, in which the substrate includes a visible light absorber and has an internal absorbance $A_1$ calculated with Test X to be described later of 0.03 or less and a parameter X of 30 $m^{-1}$ or more.

The mechanism in which the touch sensor of the present invention is excellent in contrast between black display and white display and excellent in performance of suppressing a decrease in brightness of white display when the touch sensor is applied to an image display device and black and white display is made is not necessarily clear, but the present inventors presume as follows.

The present inventors have intensively conducted studies on the above-described problem of a decrease in contrast in an image display device including a touch sensor laminated on an image display element, and resultantly found that, since an increase in brightness of black display is observed even in a dark room where no external light beam exists, an increase in brightness of black display and a decrease in contrast are not caused by reflection of an external light beam. Further studies have been conducted, and it has been presumed that the cause of the above could be that part of light emitted from a white display portion is transmitted or propagated through the inside of the substrate laminated on the image display element due to scattering, reflection, or the like, to travel toward a black display portion adjacent to the white display portion, and reaches the place observed by the observer, and as a result, the brightness of black display increases.

Based on this presumed mechanism, the present inventors have found that an increase in brightness of black display displayed adjacent to white display can be significantly suppressed and contrast between black display and white display can be improved by adding a visible light absorber to a substrate included in a touch sensor to reduce light transmitted or propagated through the inside of the substrate.

Further, in the touch sensor of the present invention, the internal absorbance $A_1$ of the substrate measured by a predetermined test method and the parameter X are each defined to be in a predetermined range. With this configuration, the decrease in light emitted from the image display element in the white display portion can be suppressed, and the contrast can be improved almost without impairing the brightness of the white display; therefore, display characteristics comparable to those of an image display device including no touch sensor can be realized, according to our presumption.

In the present specification, the expression "the effect of the present invention is excellent" means that at least one of the contrast between black display and white display and the performance of suppressing a decrease in brightness of white display when the touch sensor is applied to an image display device and black and white display is made is excellent.

Hereinafter, each member included in the touch sensor or the image display device of the present invention is described in detail.

The touch sensor of the present invention is not limited to the embodiments illustrated in FIGS. 1 and 2. For example, the sensing electrode may be disposed only on one surface of the substrate. In addition, the substrate may have a multilayer structure having a support and an undercoat layer formed only on one surface of the support, or may be constituted of the substrate alone without an undercoat layer.

<Substrate>

The substrate is a member having a function of supporting a sensing electrode.

The substrate is not particularly limited, but a resin substrate is preferable.

Examples of the material forming the substrate include a polyester resin such as polyethylene terephthalate (PET) or polyethylene naphthalate (PEN), a diacetate resin, a triacetate resin, an acrylic resin, a polycarbonate resin, triacetyl cellulose, polystyrene, polyolefin, a polyurethane-based resin, polyvinyl chloride, a polyimide resin, and a polyamide resin.

The substrate may be a single layer of the resin or a composite film including a plurality of resin layers.

The substrate is preferably a film made of a polyester resin from the viewpoint of ease of production.

Examples of the polyester resin include a linear saturated polyester synthesized from an aromatic dibasic acid or an ester-forming derivative thereof and a diol or an ester-forming derivative thereof. Specific examples of the linear saturated polyester include polyethylene terephthalate, polyethylene isophthalate, polybutylene terephthalate, poly(1,4-cyclohexylenedimethylene terephthalate), and polyethylene-2,6-naphthalate. Among them, polyethylene terephthalate, polyethylene-2,6-naphthalate, poly(1,4-cyclohexylenedimethylene terephthalate), or the like is preferable from the viewpoint of a balance between mechanical properties and cost.

The polyester resin may be a homopolymer or a copolymer. Further, a mixture obtained by blending a small amount of another type of resin such as a polyimide with a polyester resin may be used.

The content of the resin contained in the substrate is preferably 75 mass % or more and more preferably 90 mass % or more and less than 100 mass % with respect to the total mass of the substrate.

(Visible Light Absorber)

The visible light absorber contained in the substrate need only be a substance having an absorption wavelength characteristic of absorbing visible light (wavelength: 380 to 780 nm), and for example, a substance having a maximum absorption wavelength of 380 to 780 nm may be used.

Examples of the visible light absorber include a dye and a pigment, and a pigment is preferable, and a black pigment is more preferable. Examples of the material forming the visible light absorber include a carbon material, an organic material, an inorganic oxide, an inorganic nitride, and an inorganic oxynitride.

Examples of the black pigment include carbon black, graphite, aniline black, cyanine black, black iron oxide, chromium oxide, manganese oxide, titanium nitride, and titanium oxynitride, and titanium nitride or titanium oxynitride is preferable.

As the pigment, a particulate pigment can be used, and the shape thereof is not particularly limited.

From the viewpoint of preventing the display function of the display from being impaired by light scattering, the average primary particle size of the pigment is preferably 500 nm or less, more preferably 200 nm or less, and still more preferably 100 nm or less. The lower limit is not particularly limited, but is preferably 10 nm or more.

The average primary particle size of the pigment is obtained as an average value by measuring the sphere equivalent diameters of 100 objects and arithmetically averaging the measured values. The sphere equivalent diameter means a diameter of a spherical particle having the same volume. However, when a commercially available pigment is used, the catalog value is preferentially adopted as the average primary particle size.

As the visible light absorber, one type may be used alone, or two or more types may be used in combination.

The content of the visible light absorber (preferably a black pigment) is preferably 5,000 mass ppm or less, more preferably 500 mass ppm or less, still more preferably 100 mass ppm or less with respect to the total mass of the substrate from the viewpoint of preventing the display function of the display from being impaired by light scattering. The lower limit is not particularly limited as long as the internal absorbance can be set to a predetermined level or more, but is preferably 5 mass ppm or more, and more preferably 10 mass ppm or more with respect to the total mass of the substrate.

As a method for producing a substrate containing a visible light absorber, various known methods can be applied. Representative production methods include a method in which a resin containing a visible light absorber is produced, and then a substrate is produced using the resin.

Examples of the method for producing the resin containing a visible light absorber include the following methods. All of the following methods are examples when the substrate is a resin substrate containing a polyester resin.

(A) A method in which a visible light absorber is added before a transesterification reaction or an esterification reaction during synthesis of a polyester resin is completed or before a polycondensation reaction is started.

(B) A method in which a visible light absorber is added to a synthesized polyester resin, followed by melt-kneading.

(C) A method in which master pellets (or also referred to as masterbatch (MB)) to which a large amount of a visible light absorber has been added by the method (A) or (B) are produced, and then MB and a polyester resin not containing a visible light absorber are kneaded to produce a polyester resin containing a predetermined amount of a visible light absorber.

(D) A method in which MB in the above (C) is used as it is.

As a method for producing a resin containing a visible light absorber, a masterbatch method (MB method: the above (C)) in which a polyester resin and a large amount of a visible light absorber are mixed in advance with an extruder to produce MB is preferable.

In the MB method, it is also possible to adopt a method in which a polyester resin that is not dried in advance and a visible light absorber are fed to an extruder to produce MB while moisture, air, and the like are removed. In the MB method, it is preferable to produce MB using a polyester resin that has been dried in advance even a little because this can suppress an increase in the acid value of the polyester resin. In this case, exemplary methods include a method in which extrusion is performed with degassing, and a method in which extrusion is performed without degassing because of a sufficiently dried polyester resin.

It is preferable that the polyester resin to be fed for producing MB in the MB method has a moisture content reduced in advance by drying. As the drying conditions, the drying temperature is preferably 100° C. to 200° C., and more preferably 120° C. to 180° C., and the drying time is preferably 1 hour or more, more preferably 3 hours or more, and still more preferably 6 hours or more. Thus, the polyester resin is sufficiently dried such that the moisture amount of the polyester resin is preferably 50 mass ppm or less, and more preferably 30 mass ppm or less.

The method for premixing the polyester resin and the visible light absorber is not particularly limited, and may be a mixing method by a batch process or a mixing method using a kneading extruder with one screw or two or more screws. In the case of producing MB with degassing, it is preferable to adopt a method in which the polyester resin is melted at a temperature of 250° C. to 300° C., preferably 270° C. to 280° C. using a preliminary kneader provided with one or more, preferably two or more degassing ports, and continuous suction degassing at 0.05 MPa or more, more preferably 0.1 MPa or more is performed to maintain pressure reduction in the kneader.

The substrate may further contain an additive such as a light stabilizer, an antioxidant, an ultraviolet absorber, a flame retardant, a lubricant (fine particles), a nucleating agent (crystallization agent), or a crystallization inhibitor in addition to the resin and the visible light absorber.

(Undercoat Layer)

The substrate may have an undercoat layer on at least one of the two main surfaces. That is, the substrate may have a multilayer structure having a support and an undercoat layer.

When the substrate has a multilayer structure having a support and an undercoat layer, the undercoat layer is preferably disposed on the surface of the substrate on the side having the sensing electrode. The undercoat layer may be disposed on both surfaces of the support.

As the support forming a multilayer structure together with the undercoat layer, the member described above as the substrate can be used.

The undercoat layer may contain a resin (binder resin). The resin functions as a binder of the undercoat layer. As the resin contained in the undercoat layer, one type may be used alone, or two or more types may be used in combination.

The type of resin is not particularly limited, and a known resin can be used. Examples of the resin include a polyester resin, a polyether resin, an acrylic resin, an epoxy resin, a urethane resin, an alkyd resin, a spiroacetal resin, a polybutadiene resin, and a polythiol polyene resin, and an acrylic resin is preferable.

The weight average molecular weight of the resin is, for example, 500 to 500,000, preferably 1,000 to 100,000.

When the undercoat layer contains a resin, the content of the resin is, for example, 80 to 99.5 mass % with respect to the total mass of the undercoat layer.

The undercoat layer may further contain a surfactant.

The type of surfactant is not particularly limited, and a known surfactant can be used, and at least one surfactant selected from a silicone-based surfactant and a fluorine-based surfactant is preferable. The surfactant is preferably an oligomer or a polymer.

When the undercoat layer contains a surfactant, the content of the surfactant is, for example, 0.01 to 5 mass % with respect to the total mass of the undercoat layer.

The undercoat layer may further contain inorganic particles other than the visible light absorber. The type of inorganic particles is not particularly limited, and examples thereof include silica, zirconium oxide, and aluminum oxide.

The particle size of the inorganic particles is not particularly limited, but is preferably 5 to 100 nm, and more preferably 10 to 80 nm.

When the undercoat layer contains inorganic particles, the content of the inorganic particles is, for example, 0.01 to 10 mass % with respect to the total mass of the undercoat layer.

The thickness of the undercoat layer is not particularly limited, but is preferably 0.01 to 1 µm, and more preferably 0.05 to 0.3 µm.

The method for forming the undercoat layer is not particularly limited, and examples thereof include a method in which an undercoat layer-forming composition containing the foregoing components to be contained in the undercoat layer is brought into contact with the substrate to form the undercoat layer on the main surface of the substrate.

Examples of the method of bringing the substrate and the undercoat layer-forming composition into contact with each other include a method in which the undercoat layer-forming composition is applied to the surface of the substrate, and a method in which the substrate is immersed in the undercoat layer-forming composition. If necessary, after the undercoat layer-forming composition and the substrate are brought into contact with each other, a drying treatment may be performed in order to remove a solvent contained in the undercoat layer-forming composition.

The undercoat layer may be disposed on the surface of the substrate by forming the undercoat layer on a surface of a temporary support different from the substrate in the same manner as described above, thereafter bonding a surface of the undercoat layer formed on the temporary support on the side opposite to the temporary support to one surface of the substrate, and then peeling off the temporary support at an interface between the temporary support and the undercoat layer.

The undercoat layer-forming composition may contain another component other than the resin, the surfactant, and the inorganic particles described above. Examples of another component include a solvent.

The type of solvent is not particularly limited, and examples thereof include water and an organic solvent. Examples of the organic solvent include known organic solvents such as an alcohol-based solvent, an ether-based solvent, an ester-based solvent, a ketone-based solvent, a halogen-based solvent, and a hydrocarbon-based solvent. As the solvent, one type may be used alone, or two or more types may be used in admixture.

The undercoat layer-forming composition may contain a precursor (a monomer or the like) of a resin in place of the resin. In that case, the undercoat layer containing a resin may be formed by bringing a composition containing a precursor of the resin into contact with the substrate to form an undercoat layer precursor layer, followed by treatments such as an exposure treatment and a heat treatment. When the exposure treatment is performed, the undercoat layer-forming composition preferably contains a polymerization initiator. The polymerization initiator is appropriately selected according to the type of precursor of a resin.

From the viewpoint of improving the adhesion between the substrate and the undercoat layer, it is preferable to form the undercoat layer by an in-line coating method. That is, it is preferable to produce the substrate having the undercoat layer by applying the undercoat layer-forming composition to at least one main surface of an unstretched film or a film stretched in a first direction in a plane, and then stretching the coated film in a second direction orthogonal to the first direction in the plane.

(Physical Properties and the Like of Substrate)

The substrate included in the touch sensor of the present invention has an internal absorbance $A_1$ calculated with the following Test X of 0.03 or less and a parameter X of 30 $m^{-1}$ or more.

Test X: A visible light reflectance $\rho_0$ of a support white plate is obtained by the method described in JIS R 3106:2019. Similarly, measurement light is made incident on a laminate formed by laminating the support white plate and the substrate from the substrate side of the laminate, and a visible light reflectance $\rho_x$ is obtained by the method described in JIS R 3106:2019. The internal absorbance $A_1$ of the substrate is calculated from the obtained visible light reflectance $\rho_0$ and visible light reflectance $\rho_x$ by formula (1) below. The parameter X ($m^{-1}$) is calculated from the calculated internal absorbance $A_1$ and a thickness $D_1$ (m) of the substrate by formula (2) below.

$$A_1 = -\log_{10}\{(\rho_x/\rho_0)^{0.5}\} \quad \text{Formula (1):}$$

$$X = A_1/D_1 \quad \text{Formula (2):}$$

As the support white plate, one commercially available as a standard white plate (perfect diffuser) for measurement of total light spectral reflectance can be used. More specifically, for example, a barium sulfate plate, a Spectralon standard reflector, or the like can be used.

Here, when the ratio of the optical intensity of the emitted light to the optical intensity of the incident light when visible light is made incident on the substrate is defined as the internal transmittance $T_1$ of the substrate, the internal absorbance $A_1$ of the substrate is represented by formula (3) below.

$$A_1 = -\log_{10}(T_1) \quad \text{Formula (3):}$$

From the measurement method of Test X, the internal transmittance $T_1$ of the substrate, the visible light reflectance $\rho_x$ of the laminate, and the visible light reflectance $\rho_0$ of the support white plate can be considered to satisfy the relationship of formula (4) below.

$$\rho_x = T_1 \times \rho_0 \times T_1 \quad \text{Formula (4):}$$

Formula (1) is established from formula (3) and formula (4). In this manner, the internal absorbance $A_1$ of the substrate can be determined from the visible light reflectance $\rho_x$ of the laminate and the visible light reflectance $\rho_0$ of the support white plate using formula (1).

The visible light reflectance $\rho_0$ of the support white plate and the visible light reflectance $\rho_x$ of the laminate are obtained according to the measurement method and the calculation method of the visible light reflectance described in JIS R 3106:2019.

A more specific method for performing Test X is described in examples below.

Hereinafter, the "visible light reflectance $\rho_0$" and the "visible light reflectance $\rho_x$" are also referred to as "reflectance $\rho_0$" and "reflectance $\rho_x$", respectively.

The internal absorbance $A_1$ of the substrate represents the degree of attenuation of light inside the substrate, and reflection on both main surfaces of the substrate does not affect the internal absorbance $A_1$ or the parameter X. It is presumed that by setting the internal absorbance $A_1$ and the parameter X within the above ranges, an increase in brightness of black display due to transmission and propagation of light inside the substrate can be suppressed while the brightness of white display transmitted along the lamination direction of the touch sensor is maintained, and the contrast between black display and white display can be improved.

The internal absorbance $A_1$ is preferably 0.0004 to 0.0300 and more preferably 0.0010 to 0.0050 from the viewpoint that the effect of the present invention is more excellent.

The internal absorbance $A_1$ can be adjusted by, for example, the type and content of the visible light absorber added to the substrate, the type of resin forming the substrate, the thickness of the substrate, and the like.

The parameter X of the substrate is preferably 40 to 3,000 $m^{-1}$ and more preferably 80 to 1,000 $m^{-1}$ from the viewpoint that the effect of the present invention is more excellent.

The parameter X can be adjusted by, for example, the type and content of the visible light absorber added to the substrate, the type of resin forming the substrate, the thickness of the substrate, and the like.

The thickness of the substrate is, for example, 400 μm or less, and is preferably 150 μm or less, more preferably 110 μm or less, still more preferably 60 μm or less, and particularly preferably 40 μm or less from the viewpoint that the effect of the present invention is more excellent, and is preferably 10 μm or more from the viewpoint that the strength of the touch sensor is more excellent.

When the substrate has the undercoat layer, the thickness of the substrate also includes the thickness of the undercoat layer.

The thickness of the substrate can be adjusted by, for example, a discharge amount when a resin forming the substrate is melted and discharged to a cast roll using an extruder in a method for producing a substrate to be described later, a film forming speed (a speed of a cooling roll, a stretching speed that is linked therewith, or the like) when the substrate is formed into a film, or the like.

The thickness of the substrate can be measured using a linear gauge (for example, manufactured by Mitutoyo Corporation). The method for measuring the thickness of the substrate is described in detail in examples below.

(Method for Producing Substrate)

Examples of a method for producing a substrate containing a visible light absorber include a method including steps of: stretching an unstretched polyester film containing a polyester resin, a visible light absorber, and the like in a first direction (first stretching step); applying an undercoat layer-forming composition to at least one main surface of the polyester film stretched in the first direction (undercoat layer forming step); and stretching the polyester film stretched in the first direction in a second direction orthogonal to the first direction (second stretching step).

The method for producing a substrate containing a visible light absorber is not limited to the above method.

Hereinafter, in the method for producing a substrate, the expression of simple "film" includes all of an unstretched polyester film, a polyester film stretched in the first direction, and a polyester film stretched in the first direction and the second direction. In addition, the simple "film" covers an embodiment of a polyester film alone and an embodiment of having an undercoat layer on a surface of a polyester film.

—First Stretching Step—

In the first stretching step, an unstretched polyester film is stretched in a first direction.

The unstretched polyester film is obtained by, for example, drying and then melting a polyester resin that is a raw material, allowing the resulting melt to pass through a gear pump or a filter, then extruding the melt onto a cooling roll via a die, and cooling and solidifying the melt.

The method for producing an unstretched polyester film containing a visible light absorber is as described above.

The melting of the polyester resin is performed using, for example, an extruder. As the extruder, a single-screw extruder may be used, or a twin-screw extruder may be used.

The extrusion is preferably performed under a vacuum exhaust condition or in an inert gas atmosphere. The temperature of the extruder is preferably in the range of (the melting point of the polyester resin to be used+80° C.) or lower from the melting point of the polyester resin to be used, more preferably in the range of (the melting point+10° C.) or higher and (the melting point+70° C.) or lower, still more preferably in the range of (the melting point+20° C.) or higher and (the melting point+60° C.) or lower. When the temperature of the extruder is (the melting point+10° C.) or higher, the resin is sufficiently melted. Meanwhile, it is preferable that the temperature of the extruder be (the melting point+70° C.) or lower because decomposition of polyester and the like is suppressed.

It is preferable to dry the polyester resin raw material to be fed before the polyester resin is melted by extrusion. The water content of the polyester resin raw material is preferably 10 to 300 mass ppm and more preferably 20 to 150 mass ppm.

The extruded melt is subjected to flow casting on a cast drum through members such as a gear pump, a filter, and a multilayer die.

In a multilayer die method, both a multi-manifold die and a feed block die can be suitably used. Examples of the shape of the die include a T-die, a hanger coat die, and a fish tail.

On the cast drum, the molten resin (melt) can be brought into close contact with the cooling roll using an electrostatic application method. The surface temperature of the cast drum can be set to about 10° C. to about 40° C. The diameter of the cast drum is preferably 0.5 to 5 m, and more preferably 1 to 4 m. The drive speed of the cast drum (linear speed in the outermost circumference) is preferably 1 to 50 m/min, and more preferably 3 to 30 m/min.

Examples of the first direction in which the unstretched polyester film is stretched include a machine direction (MD) and a transverse direction (TD), and MD is preferable.

The MD stretching can be performed, for example, by making the peripheral speed of the roll on the outlet side faster than the peripheral speed of the roll on the inlet side while the film is heated when the film is conveyed using two pairs of rolls. The MD stretching may be performed in one stage or in plural stages.

In the first stretching step, the unstretched polyester film is preferably heated.

The temperature range during heating is preferably the glass temperature (Tg: unit ° C.) of the polyester film or higher and (Tg+60° C.) or lower, more preferably (Tg+3° C.) or higher and (Tg+40° C.) or lower, still more preferably (Tg+5° C.) or higher and (Tg+30° C.) or lower.

The stretching ratio in the first stretching step is preferably 270% to 500%, more preferably 280% to 480%, and still more preferably 290% to 460%. The stretching ratio is determined using a formula below.

Stretching ratio (%)=100×{(length along stretching direction after stretching)/(length along stretching direction before stretching)}

—Undercoat Layer Forming Step—

In the undercoat layer forming step, the undercoat layer-forming composition is applied to at least one main surface of the polyester film stretched in the first direction (hereinafter also referred to as "uniaxially stretched film").

The formation of the undercoat layer by application is preferable because it is simple and a highly uniform thin film can be formed. As the application method, for example, a known method such as a method using a gravure coater or a bar coater can be used. The undercoat layer-forming composition is as described above.

The application of the undercoat layer-forming composition to the uniaxially stretched film is preferably performed in-line following the first stretching step.

Before the undercoat layer-forming composition is applied, the surface of the uniaxially stretched film is preferably subjected to a surface treatment. Examples of the surface treatment include a corona discharge treatment, a glow treatment, an atmospheric pressure plasma treatment, a flame treatment, and a UV treatment.

It is preferable to provide a step of drying the coating film after the undercoat layer-forming composition is applied.

The drying step is a step of supplying drying air to the coating film. The average wind speed of the drying air is preferably 5 to 30 m/s, more preferably 7 to 25 m/s, and still more preferably 9 to 20 m/s.

The drying of the coating film preferably also serves as a heat treatment.

—Second Stretching Step—

In the second stretching step, the uniaxially stretched film on which the coating film of the undercoat layer-forming composition has been formed is further stretched in the second direction orthogonal to the first direction in the film plane.

By stretching in the second direction, the uniaxially stretched film is stretched together with the undercoat layer-forming composition to form a polyester film coated with the undercoat layer (in-line coating layer).

The second direction in which the film is stretched in the second stretching step need only be a direction orthogonal to the first direction. Examples of the second direction include a machine direction (MD) and a transverse direction (TD), and TD is preferable.

TD stretching can be performed, for example, by a stretching method in which both ends in the width direction of the film are held by chucks and the distance between the chucks at both ends is increased under heating in an oven using a tenter.

Preferred embodiments of the stretching temperature, the stretching ratio, and the like in the second stretching step are the same as those in the first stretching step.

The second stretching step is preferably followed by a heat fixing step. The conditions of the heat fixing step are not particularly limited, but it is preferable to subject the film to a heat treatment at 175° C. to 230° C. for 1 to 60 seconds.

The heat fixing step is preferably performed, for example, in a state where both ends in the width direction of the film are held by the chucks in the tenter after the second stretching step in MD is performed by the stretching method using the tenter. The distance between the chucks at both ends in the heat fixing step may be the same as the distance between the chucks at both ends at the end of the second stretching step, or may be increased, or may be reduced. By performing the heat fixing treatment, microcrystals are generated in the film, and the mechanical characteristics and durability can be improved.

The heat fixing step is preferably followed by a thermal relaxation step. The thermal relaxation step is a treatment of applying heat to the film for stress relaxation to shrink the film. In the thermal relaxation step, it is preferable to relax the film in at least one of the machine direction (MD) and the transverse direction (TD). The relaxation amount in the thermal relaxation step (the ratio of the length after the thermal relaxation step to the length after the second stretching step) is preferably 1 to 15% in the direction in which the film is relaxed. The temperature of the thermal relaxation step is preferably (Tg+50°) C to (Tg+180° C.)

Thermal relaxation in TD can be performed, for example, by reducing the distance between chucks that hold both ends of the film in the tenter. Thermal relaxation in MD can be performed by narrowing the distance between adjacent chucks in the tenter. More specifically, this can be achieved by coupling adjacent chucks in a pantograph shape and shrinking the pantograph.

Thermal relaxation in TD can also be performed by taking out the film from the tenter and then performing a heat treatment while the film is conveyed with a low tension.

The film obtained by performing the first stretching step, the undercoat layer forming step, and the second stretching step is then optionally subjected to a treatment of trimming both ends of the film held by clips, a treatment of knurling (embossing) both ends of the film, and the like, and then wound up.

The TD width of the film thus formed is preferably 0.8 to 10 m, and more preferably 1 to 6 m.

The above steps can provide a substrate formed of a biaxially stretched polyester film having an undercoat layer on its surface and containing a visible light absorber.

<Sensing Electrode>

The touch sensor of the present invention includes a sensing electrode disposed on at least one surface side of a substrate.

The sensing electrode includes plural conductive thin wires, and functions as a sensor electrode for sensing a touch operation.

While FIG. 1 illustrates the plural sensing electrodes 11 extending along Y direction on the surface 1a of the substrate 1 and the plural sensing electrodes 21 extending along X direction on the surface 1b of the substrate 1, only one sensing electrode may be disposed on one surface of the substrate. The sensing electrode may be disposed only on one surface of the substrate.

The sensing electrode may have a predetermined pattern formed of conductive thin wires. The pattern formed is not particularly limited, and is preferably a geometric shape combining some of triangles such as an equilateral triangle, an isosceles triangle, and a right triangle, quadrangles such as a square, a rectangle, a rhombus, a parallelogram, and a trapezoid, a (regular) n-polygon such as a (regular) hexagon and a (regular) octagon, a circle, an ellipse, a star, and the like, and more preferably a mesh shape (mesh pattern).

Figure 3:
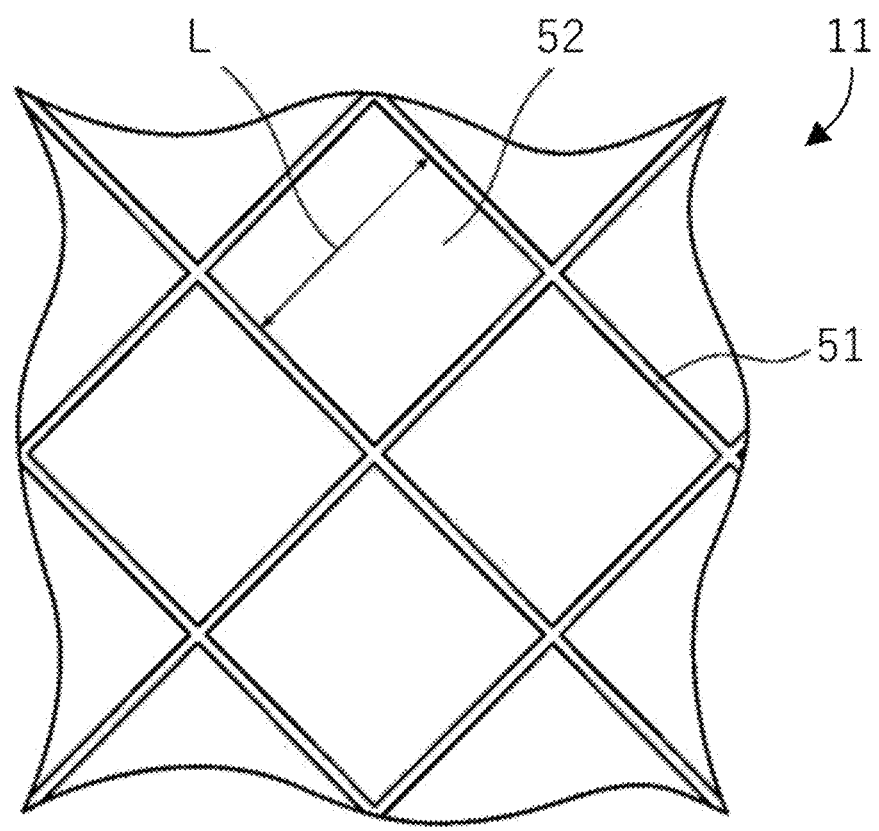
FIG. 3 is a plan view illustrating an example of a sensing electrode included in the touch sensor of the present invention.

As illustrated in FIG. 3, the mesh shape means a shape including plural openings (lattices) formed by intersecting conductive thin wires.

FIG. 3 is a plan view illustrating an example of a configuration of the sensing electrode included in the touch sensor of the present invention.

In the sensing electrode 11 illustrated in FIG. 3, a mesh pattern in which the shape of an opening 52 is a square with a side length of L is formed by conductive thin wires 51.

The shape of the mesh pattern of the sensing electrode is not limited to a square, and may be another shape. Examples of the shape of the mesh pattern of the sensing electrode include the geometric shapes listed above. In addition, the shape of one side of the opening may be a curved shape or an arc shape in addition to a linear shape. In the case of adopting an arc shape, for example, as two opposing sides, an outwardly convex arc shape may be adopted, and as the other two opposing sides, an inwardly convex arc shape may be adopted. In addition, the shape of each side may be a wavy line shape in which an outwardly convex arc and an inwardly convex arc are continuous. Of course, the shape of each side may be a sine curve. The mesh pattern is not particularly limited, and may be a random pattern or a regular pattern, or may be a regular mesh pattern in which plural congruent shapes are repeatedly arranged.

The mesh pattern of the sensing electrode is preferably a regular mesh pattern having rhombus or square openings of the same shape. The length L of one side of the opening is preferably 5 to 1,500 μm, and more preferably 10 to 1,000 μm from the viewpoint of visibility. When the length of one side of the opening is within the above range, it is possible to maintain good transparency, and when the touch sensor is attached to a display surface of an image display device, a display image can be visually recognized without discomfort.

The aperture ratio of the mesh pattern of the sensing electrode is preferably 90% or more and more preferably 95% or more from the viewpoint of visible light transmittance. The upper limit is not particularly limited, but is, for example, less than 100%. The aperture ratio corresponds to the area ratio of the openings excluding the conductive thin wires in a region where the sensing electrode is provided to the entire region where the sensing electrode is provided.

The mesh pattern of the sensing electrode can be observed and measured using an optical microscope.

The line width of the conductive thin wire forming the sensing electrode is preferably 10 μm or less, and more preferably 5 μm or less from the viewpoint of more excellent visibility. The lower limit is not particularly limited, but is preferably 0.1 μm or more, and more preferably 0.5 μm or more from the viewpoint of more excellent conductivity characteristics of the conductive thin wire.

The height of the conductive thin wire is not particularly limited, and is, for example, 0.1 to 10 μm, and preferably 0.3 to 5 μm.

The line width and height of the conductive thin wire are obtained by selecting conductive thin wires at arbitrary five sites using a scanning electron microscope and arithmetically averaging values corresponding to the measured line widths and heights.

The conductive thin wire preferably contains a metal.

As the metal, silver (metallic silver), copper (metallic copper), gold (metallic gold), nickel (metallic nickel), palladium (metallic palladium), or a mixture of two or more thereof is preferable, silver, copper, or a mixture thereof is more preferable, and silver is still more preferable from the viewpoint of more excellent conductivity. The conductive thin wire may contain only silver as a metal, and it is preferable that the metal be entirely constituted of silver. When the metal is entirely constituted of silver, occurrence of a disconnection failure of the conductive thin wire is reduced. The form of the metal in the conductive thin wire is not limited, and examples thereof include a particulate form and a form in which the metal is layered and is spread in the conductive thin wire.

The conductive thin wire may be a conductive thin wire containing metallic silver and a polymer binder such as gelatin or an acrylic-styrene latex, which is suitable for forming a mesh pattern. When the conductive thin wire contains a polymer binder, metal particles may be present dispersedly in the polymer, or metal particles may be aggregated and present as aggregates in the polymer. The type of polymer is not particularly limited, and a known polymer can be used.

The conductive thin wire may be a metal thin wire made of a metal of aluminum, copper, silver, molybdenum, or titanium, or an alloy thereof. The conductive thin wire may have a laminated structure thereof, and for example, a metal thin wire having a laminated structure of molybdenum/copper/molybdenum, molybdenum/aluminum/molybdenum, or the like can be used.

The conductive thin wire may contain metal oxide particles, a metal paste such as a silver paste or a copper paste, or metal nanowire particles such as silver nanowire or copper nanowire particles.

(Other Members)

Other members than the sensing electrode may be disposed on a surface of the substrate.

Examples of other members include electrode connection terminals 12 and 22, peripheral wires 13 and 23, and external connection terminals 14 and 24 shown in FIG. 1.

These members have a function of transmitting an electric signal sensed by the sensing electrode to an external device.

The touch sensor may have a dummy electrode as another member.

The touch sensor may be used in the form of a laminate including the touch sensor and other members such as a pressure sensitive adhesive sheet and a release sheet during handling and conveyance. The release sheet functions as a protective sheet for preventing occurrence of scratches in the conductive member during conveyance of the laminate. The touch sensor may be handled in the form of, for example, a composite including the touch sensor, a pressure sensitive adhesive sheet, and a protective layer in this order.

<Method for Producing Touch Sensor>

The method for producing a touch sensor is not particularly limited as long as the sensing electrode can be formed on a surface of the substrate produced by the above method. As a method for forming a sensing electrode, for example, a sputtering method, a plating method, a silver salt method, a printing method, and the like can be appropriately used.

A method for forming a sensing electrode by a sputtering method is described. First, a copper foil layer is formed by sputtering, and a copper wire is formed from the copper foil layer by photolithography, whereby a sensing electrode can be formed. A copper foil layer may also be formed by so-called vapor deposition instead of sputtering. As the copper foil layer, an electrolytic copper foil can be used in addition to a sputtered copper foil or a deposited copper foil. More specifically, a step of forming a copper wire described in JP 2014-029614 A can be used.

A method for forming a sensing electrode by a plating method is described. For example, an electroless plating base layer is subjected to electroless plating to form a metal plating film on the base layer. This metal plating film can be used as a sensing electrode. In this case, the sensing electrode is formed by forming a catalyst ink containing at least metal fine particles in a pattern shape on a substrate and then immersing the substrate in an electroless plating bath to thereby form a metal plating film. More specifically, a method for producing a metal-coated substrate described in JP 2014-159620 A can be used.

In addition, a sensing electrode is formed by forming a resin composition having at least a functional group capable of interacting with a metal catalyst precursor in a pattern shape on a substrate, thereafter applying a catalyst or a catalyst precursor, and immersing the substrate in an electroless plating bath to thereby form a metal plating film. More specifically, a method for producing a metal-coated substrate described in JP 2012-144761 A can be applied.

A method for forming a sensing electrode by a silver salt method is described. First, a silver salt emulsion layer containing a silver halide is subjected to an exposure treatment using an exposure pattern corresponding to the pattern of a sensing electrode, and then subjected to a development treatment, whereby a sensing electrode can be formed. More specifically, a method for producing a metal thin wire described in JP 2012-006377 A, JP 2014-112512 A, JP 2014-209332 A, JP 2015-022397 A, JP 2016-192200 A, or WO 2016/157585 can be used.

A method for forming a sensing electrode by a printing method is described. First, a conductive paste containing conductive powder is applied to a substrate so as to have the same pattern as that of a sensing electrode, and then subjected to a heat treatment, whereby a sensing electrode can be formed. The pattern formation using the conductive paste is performed by, for example, an inkjet method or a screen printing method. More specifically, as the conductive paste, a conductive paste described in JP 2011-028985 A can be used.

[Touch Panel]

A touch panel of the present invention includes the touch sensor of the present invention. The touch panel of the present invention can be more suitably used as a capacitive touch panel.

The configuration of the touch panel of the present invention is not particularly limited as long as the touch sensor of the present invention is included, and for example, the configuration described in "Monthly display, separate volume, new course for practical use of touch panel" supervised by Yuji Mitani and Yoshio Itakura (Japan) (Techno Times, 2011) can be referred to. Further, the configurations disclosed in "Latest touch panel technology" (Japan) (Techno Times, Jul. 6, 2009), "Technologies and Developments of Touchpanels" supervised by Yuji Mitani (Japan) (CMC Publishing Co., Ltd., December 2004), FPD International 2009 Forum T-11 lecture textbook, Cypress Semiconductor Corporation, Application Note AN2292, and the like can be applied to the touch panel of the present invention.

The type of the touch panel may be an external type or a display integrated type. Examples of the external type include a film sensor. Examples of the display integrated type include an on-cell type (for example, JP 2013-168125 A, FIG. 19) and other configurations (for example, JP 2013-164871 A, FIG. 6).

The use form of the touch panel of the present invention is not particularly limited, but it is preferably combined with an image display element to form an image display device.

[Image Display Device]

An image display device of the present invention includes an image display element and the touch sensor of the present invention. The image display device can be used as a touch panel (capacitive touch panel) owing to an image display element and the touch sensor.

Examples of the configuration of the image display device of the present invention include an embodiment in which the image display element 30, the pressure sensitive adhesive layer 4, the touch sensor 10 of the present invention, the pressure sensitive adhesive layer 4, and the protective layer 40 are included in this order as in the image display device 100 shown in FIG. 2.

As the image display element, an element having a display surface for displaying an image and the like can be used, and examples thereof include a liquid crystal display element, an organic electroluminescence display element (OLED), a cathode ray tube (CRT) image display device, a vacuum fluorescent display (VFD), a plasma display panel (PDP), a surface-conduction electron-emitter display (SED), a field emission display (FED), and an electronic paper.

As the image display element, an image display element in a form suitable for the application is appropriately used. An image display element in the form of a panel such as a liquid crystal display panel or an organic electroluminescence display panel is preferable because the image display device can be made thinner.

As illustrated in FIG. 2, the image display device may further have a protective layer on the viewing side of the touch sensor (the side opposite to the image display element). In this case, the surface on the viewing side of the protective layer is the touch surface and the operation surface of the image display device. That is, an input operation is made using the surface on the viewing side of the protective layer as an operation surface. The touch surface means a surface that detects contact of a finger, a stylus pen, or the like. The surface on the viewing side of the protective layer serves as a viewing surface for an image displayed on the display surface of the image display element.

Since the surface of the protective layer is a touch surface, a hard coat layer may be provided on the surface as necessary. The surface of the protective layer is preferably subjected to a treatment for imparting various functions such as an anti-scratch treatment, an anti-glare treatment, an anti-fouling treatment, an anti-fog treatment, and an anti-reflection treatment.

The configuration of the protective layer is not particularly limited, but is preferably transparent so that an image displayed on the display surface of the image display element can be visually recognized. As the protective layer, for example, a plastic film, a plastic plate, a glass plate, or the like is used. The thickness of the protective layer is preferably appropriately selected according to the application. The protective layer made of a glass is called a cover glass.

Examples of the raw material of the plastic film and the plastic plate include polyesters such as polyethylene terephthalate (PET) and polyethylene naphthalate (PEN), polyolefins such as polyethylene (PE), polypropylene (PP), polystyrene, and EVA (polyethylene copolymerized with vinyl acetate), a vinyl-based resin, a polycarbonate (PC), a polyamide, a polyimide, an acrylic resin, triacetyl cellulose (TAC), a cycloolefin-based resin (COP), polyvinylidene fluoride (PVDF), polyarylate (PAR), polyethersulfone (PES), a polymeric acrylic resin, a fluorene derivative, and polymers such as crystalline COP.

As the protective layer, a polarizing plate, a circularly polarizing plate, or the like may be used.

The protective layer is preferably thin from the viewpoint of improving contrast in addition to the viewpoint of weight reduction. Specifically, the thickness of the protective layer is preferably 1 mm or less, more preferably 0.5 mm or less, and still more preferably 0.3 mm or less. The lower limit is not particularly limited, and may be, for example, 0.1 mm or more.

The refractive index of the protective layer is preferably 1.40 to 1.70. The difference in refractive index between the protective layer and other members is preferably 0.1 or less.

The image display device may further include a pressure sensitive adhesive layer. The pressure sensitive adhesive layer is disposed between the substrate and other members such as an image display element and a protective layer.

An image display device in which an image display element, a pressure sensitive adhesive layer, and the touch sensor of the present invention are disposed in this order is one preferred embodiment of the present invention.

The configuration of the pressure sensitive adhesive layer is not particularly limited as long as the pressure sensitive adhesive layer is transparent, has electrical insulation properties, and has a function of fixing the substrate and another member together.

As a pressure sensitive adhesive forming the pressure sensitive adhesive layer, for example, an optically clear adhesive (OCA) and an optically clear resin (OCR) such as an ultraviolet (UV) curable resin can be used. The pressure sensitive adhesive layer may further contain a visible light absorber.

The thickness of the pressure sensitive adhesive layer is preferably 0.5 mm or less, more preferably 0.25 mm or less, and still more preferably 0.15 mm or less. The lower limit is not particularly limited, and may be, for example, 10 μm or more.

The present invention is basically configured as described above. The present invention is not limited to the above embodiments, and various improvements or changes may be made without departing from the gist of the present invention.

EXAMPLES

Hereinafter, the present invention is described in more detail based on examples.

Materials, amounts of use, proportions, details of treatments, treatment procedures, and the like described in the following examples can be appropriately changed without departing from the gist of the present invention. Therefore, the scope of the present invention should not be construed as being limited by the following examples.

Example 1

[Production of Substrate]
—Production of Polyester-Containing Pellets—

A mixed slurry of 100 kg of high-purity terephthalic acid (manufactured by Mitsui Chemicals, Inc.) and 45 kg of ethylene glycol (manufactured by Nippon Shokubai Co., Ltd.) was sequentially supplied over 4 hours to an esterification reaction tank into which about 123 kg of bis(hydroxyethyl)terephthalate was previously fed and which was maintained at a temperature of 250° C. and a pressure of 1.2×105 Pa, and an esterification reaction was further carried out over 1 hour after the supply was completed. Thereafter, 123 kg of the obtained esterification reaction product was transferred to a polycondensation reaction tank.

Subsequently, ethylene glycol in an amount of 0.3 mass % with respect to the resulting polymer was added to the polycondensation reaction tank to which the esterification reaction product had been transferred. After stirring for 5 minutes, an ethylene glycol solution of magnesium acetate tetrahydrate was added so as to be 70 mass ppm with respect to the resulting polymer. After further stirring for 5 minutes, a 2 mass % ethylene glycol solution of a titanium alkoxide compound was added such that the amount of the titanium alkoxide compound with respect to the resulting polymer was 10 mass ppm. When 5 minutes elapsed after that, a 10 mass % ethylene glycol solution of trimethyl phosphate was added so as to be 60 mass ppm with respect to the resulting polymer. Thereafter, while the mixture containing the low polymer was stirred at 30 rpm, the temperature of the reaction system was gradually lowered from 250° C. to 27.5° C., and the pressure was lowered to 40 Pa. The time until the final temperature was reached and the time until the final pressure was reached were both set to 60 minutes. When a predetermined stirring torque was reached, the reaction system was purged with nitrogen, and the pressure was returned to normal pressure (101.325 kPa) to stop the polycondensation reaction. Then, the polymer obtained by the polycondensation reaction was discharged into cold water in a strand shape and immediately cut to produce polymer pellets (diameter: about 3 mm, length: about 7 mm). The time from the start of pressure reduction to reach the predetermined stirring torque was 3 hours.

Here, as the titanium alkoxide compound, a titanium alkoxide compound (Ti content=4.44 mass %) synthesized according to the synthesis method described in Example 1 in paragraph [0083] in JP 2005-340616 A was used.

—Production of Master Pellets—

Titanium oxynitride as a visible light absorber was added to part of the pellets and kneaded to produce master pellets. The amount of titanium oxynitride added at this time was the amount making the content of the titanium oxynitride be 0.5 mass % with respect to the total mass of the master pellets.

As the titanium oxynitride, UF-8 (trade name, average primary particle size=20 nm) manufactured by Mitsubishi Materials Electronic Chemicals Co., Ltd. was used.

—Production of Substrate—

The pellets and the master pellets were mixed to obtain a mixture A. At this time, the mixing ratio between the pellets and the master pellets was adjusted such that the content of titanium oxynitride with respect to the total mass of the mixture A (the total amount of the pellets and the master pellets) was 50 mass ppm. The obtained mixture A was melted at 280° C. and cast on a metal drum to produce an unstretched polyethylene terephthalate (PET) film having a thickness of about 0.5 mm.

Thereafter, an unstretched PET film was stretched 3.5 times in the machine direction (MD) at 90° C.

Then, an undercoat layer-forming composition having the following composition was applied to both surfaces of the stretched uniaxially stretched PET film by an in-line coating method such that the application amount per surface area of the film was 5.4 mL/m².

(Composition of Undercoat Layer-Forming Composition)
Water: 76.9 mass % (water other than water contained in the following chemicals)
Surfactant: 0.3 mass %
SNOWTEX ST-ZL (manufactured by Nissan Chemical Corporation): 0.3 mass %
Carbodilite V-02 (manufactured by Nisshinbo Chemical Inc.): 2.5 mass %
Polymer latex containing a polymer represented by (P-1) below (hereinafter, also referred to as "polymer 1"), a dispersant made of dialkylphenyl PEO (polyethylene oxide) sulfuric acid ester, and water (the ratio of the mass of the dispersant to the mass of the polymer 1 (mass of dispersant/mass of polymer 1, unit: g/g) is 0.02, and the solid content is 25 mass %): 20 mass %

[Chemical formula 1]

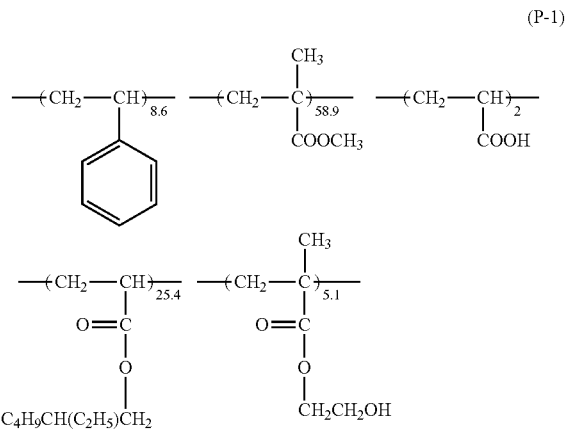

The polymer 1 was synthesized with reference to Japanese Patent No. 3305459 B2 and Japanese Patent No. 3754745 B2.

A PET film having both surfaces coated with the undercoat layer-forming composition was stretched in the transverse direction (TD). TD stretching was performed under the conditions of a temperature of 140° C. and a stretching ratio of 4 times.

A PET film on which an undercoat layer had been formed was subjected to a heat fixing treatment at a temperature on a film surface of 240° C. for 5 seconds, and then subjected to a thermal relaxation treatment at 200° C. in MD and TD directions at an MD relaxation rate of 5% and a TD relaxation rate of 5% to obtain a visible light absorber-containing biaxially stretched PET film (hereinafter, also referred to as "substrate 1") having an undercoat layer with a thickness of 0.05 μm on both main surfaces and having a thickness $D_1$ of 40 μm.

[Production of Touch Sensor]

A conductive pattern was formed on both surfaces of the substrate 1 by the following method to obtain a touch sensor.

—Preparation of Silver Halide Emulsion—

To liquid 1 below kept at a temperature of 28° C. and a pH of 4.5, liquid 2 and liquid 3 below in amounts corresponding to 90% of the amounts of the liquid 2 and the liquid 3 were added simultaneously over 20 minutes while the liquid 1 was stirred, thereby forming 0.08 μm core particles. Subsequently, liquid 4 and liquid 5 below were added to the obtained mixed liquid over 8 minutes, and further, the liquid 2 and liquid 3 in the remaining 10% amount were added over 2 minutes to allow the core particles to grow to 0.10 μm. Further, 0.15 g of potassium iodide was added to the obtained mixed liquid, and the mixture was aged for 5 minutes to finish particle formation.

Liquid 1:
  Water: 750 mL
  Gelatin: 8.6 g
  Potassium bromide: 3 g
  1,3-Dimethylimidazolidine-2-thione: 20 mg Sodium benzenethiosulfonate: 10 mg
  Citric acid: 0.7 g
Liquid 2:
  Water: 300 mL
  Silver nitrate: 150 g
Liquid 3:
  Water: 300 mL
  Sodium chloride: 38 g
  Potassium bromide: 32 g
  Potassium hexachloroiridate (III) (0.005% KCl 20% aqueous solution): 5 mL
  Ammonium hexachlororhodate (0.001% NaCl 20% aqueous solution): 7 mL
Liquid 4:
  Water: 100 mL
  Silver nitrate: 50 g
Liquid 5:
  Water: 100 mL
  Sodium chloride: 13 g
  Potassium bromide: 11 g
  Yellow prussiate of potash: 5 mg Thereafter, the particles were washed with water by a flocculation method according to a conventional method. Specifically, the temperature of the mixed liquid was lowered to 35° C., and the pH of the mixed liquid was lowered using sulfuric acid until the silver halide particles precipitated (pH was in the range of 3.6±0.2). Subsequently, about 3 L of supernatant was removed from the mixed liquid (first water washing). Subsequently, 3 L of distilled water was added to the mixed liquid from which the supernatant was removed, and then sulfuric acid was added until the silver halide particles precipitated. Again, 3 L of supernatant was removed from the mixed liquid (second water washing). The same operation as the second water washing was further repeated once (third water washing) to complete the water washing and desalting step.

The pH of the emulsion after the water washing and desalting was adjusted to 6.4 and pAg was adjusted to 7.5, and then 2.5 g of gelatin, 10 mg of sodium benzenethiosulfonate, 3 mg of sodium benzenethiosulfinate, 15 mg of sodium thiosulfate, and 10 mg of chloroauric acid were added to the emulsion, and the resulting mixture was subjected to chemical sensitization at 55° C. to obtain optimum sensitivity. Thereafter, 100 mg of 1,3,3a,7-tetraazaindene as a stabilizer and 100 mg of Proxel (trade name, manufactured by ICICo., Ltd.) as a preservative were added to the emulsion.

The emulsion finally obtained was a silver chlorobromide cubic particle emulsion in which 0.08 mol % of silver iodide is contained, the silver chlorobromide contains 70 mol % silver chloride and 30 mol % silver bromide, the average particle size (equivalent spherical diameter) is 100 nm, and the coefficient of variation is 9%.

—Preparation of Photosensitive Layer-Forming Composition

To the above emulsion, 1,3,3a,7-tetraazaindene ($1.2 \times 10^{-4}$ mol/mol Ag), hydroquinone ($1.2 \times 10^{-2}$ mol/mol Ag), citric acid ($3.0 \times 10^{-4}$ mol/mol Ag), 2,4-dichloro-6-hydroxy-1,3,5-triazine sodium salt (0.90 g/mol Ag), and a trace amount of a hardener were added to obtain a composition. Subsequently, the pH of the composition was adjusted to 5.6 using citric acid.

A polymer latex containing the polymer 1, a dispersant made of dialkylphenyl PEO sulfuric acid ester, and water (the ratio of the mass of the dispersant to the mass of the polymer 1 (mass of dispersant/mass of polymer 1, unit: g/g) is 0.02, and the solid content is 22 mass %) was added to the above composition such that the ratio of the mass of the polymer 1 to the total mass of gelatin in the composition (mass of polymer 1/mass of gelatin, unit: g/g) was 0.25/1 to obtain a polymer latex-containing composition. Here, in the polymer latex-containing composition, the ratio of the mass of gelatin to the mass of silver derived from the silver halide (mass of gelatin/mass of silver derived from silver halide, unit: g/g) was 0.11.

Further, EPOXY RESIN DY 022 (trade name, manufactured by Nagase ChemteX Corporation) was added as a crosslinking agent. The amount of the crosslinking agent added was adjusted such that the amount of the crosslinking agent in the silver halide-containing photosensitive layer described later was 0.09 g/m².

A photosensitive layer-forming composition was prepared as described above.

(Step H, Step a, Step I)

Subsequently, on the undercoat layer on one surface of the substrate 1, a silver halide-free layer-forming composition obtained by mixing the above-described polymer latex and gelatin, the above-described photosensitive layer-forming composition, and a protective layer-forming composition obtained by mixing the polymer latex and gelatin were simultaneously layered and applied to form a silver halide-free layer, a silver halide-containing photosensitive layer, and a protective layer on the undercoat layer.

The thickness of the silver halide-free layer was 2.0 μm, the mixing mass ratio between the polymer 1 and gelatin (polymer 1/gelatin) in the silver halide-free layer was 2/1, and the content of the polymer 1 was 1.3 g/m².

The thickness of the silver halide-containing photosensitive layer was 2.5 μm, the mixing mass ratio between the polymer 1 and gelatin (polymer 1/gelatin) in the silver halide-containing photosensitive layer was 0.25/1, and the content of the polymer 1 was 0.19 g/m².

The thickness of the protective layer was 0.15 μm, the mixing mass ratio between the polymer 1 and gelatin (polymer 1/gelatin) in the protective layer was 0.1/1, and the content of the polymer 1 was 0.015 g/m².

Further, a silver halide-free layer, a silver halide-containing photosensitive layer, and a protective layer were formed also on the undercoat layer on the other surface of the substrate 1 in the same manner as described above. Hereinafter, the obtained photosensitive layer-containing laminate is also referred to as "photosensitive member A".
(Step B)

The photosensitive layer of the photosensitive member A produced was exposed through a photomask having a pattern corresponding to the mesh pattern shown in FIG. 3 using parallel light from a high-pressure mercury lamp as a light source. As the photomask, a mask for forming a pattern was used. The photosensitive layer was exposed with the photomask being in contact with the photosensitive member A. The shape of the photomask and the exposure conditions were set such that, in a sensing electrode included in the touch sensor 1 obtained in step G described later, a unit square lattice having an opening with a side length L of 400 μm was formed, and the line width w of a metal thin wire was 1.8 μm.

After the exposure, the obtained sample was developed with a developer described later, and further subjected to a development treatment using a fixing solution (trade name: N3X-R for CN16X, manufactured by FUJIFILM Corporation). Thereafter, the sample was rinsed with pure water at 25° C. and dried to obtain a sample having a silver-containing layer containing metallic silver formed in a mesh pattern shape.
(Composition of Developer)

The following compounds are contained in 1 liter (L) of the developer.

Hydroquinone: 0.037 mol/L
N-methylaminophenol: 0.016 mol/L
Sodium metaborate: 0.140 mol/L
Sodium hydroxide: 0.360 mol/L
Sodium bromide: 0.031 mol/L
Potassium metabisulfite: 0.187 mol/L The sample obtained was immersed in warm water at 50° C. for 180 seconds. Thereafter, water was removed with air shower, and the sample was left to air dry.
(Step C)

The sample obtained in step B was subjected to a superheated steam treatment by being carried into a superheated steam treatment tank at 110° C. and allowed to stand for 30 seconds. The steam flow rate at this time was 100 kg/h.
(Step D)

The sample obtained in step C was immersed in an aqueous protease solution (40° C.) for 30 seconds. The sample was taken out from the aqueous protease solution, and the sample was washed by being immersed in warm water (liquid temperature: 50° C.) for 120 seconds. Thereafter, water was removed with air shower, and the sample was left to air dry.

The aqueous protease solution used was prepared according to the following procedure.

Triethanolamine and sulfuric acid were added to an aqueous solution of a protease (30 L of Bioplase manufactured by Nagase ChemteX Corporation) (concentration of protease: 0.5 mass %) to adjust the pH to 8.5.
(Step E)

The sample obtained in step D was immersed in a 1 mass % aqueous glutaric acid solution (74° C.) having a pH of 2.7 for 30 seconds. The sample was taken out from the aqueous glutaric acid solution, and the sample was washed by being immersed in water at 30° C. for 5 seconds. Glutaric acid used was manufactured by FUJIFILM Wako Pure Chemical Corporation.

(Step F)

The sample obtained in step E was immersed in a plating solution A (30° C.) having the composition below for 5 minutes. The sample was taken out from the plating solution A, and washed by being immersed in water (liquid temperature: 20° C.) for 120 seconds.

The composition of the plating solution A (total amount: 1,200 mL) was as below. The pH of the plating solution A was 9.9, and was adjusted by adding a specified amount of potassium carbonate (manufactured by FUJIFILM Wako Pure Chemical Corporation). Components used shown below were all manufactured by FUJIFILM Wako Pure Chemical Corporation. No change in line width was observed after the plating treatment from that before the plating treatment.
(Composition of Plating Solution A)

$AgNO_3$: 2.1 g
Sodium sulfite: 86 g
Sodium thiosulfate pentahydrate: 60 g
Aron T-50 (manufactured by Toagosei Co., Ltd., solid content concentration: 40%): 36 g
Methylhydroquinone: 13 g
Potassium carbonate: specified amount
Water: balance
(Step G)

The sample obtained in step F was subjected to a superheated steam treatment by being carried into a superheated steam treatment tank at 110° C. and allowed to stand for 30 seconds. The steam flow rate at this time was 100 kg/h. Thus, a touch sensor 1 of Example 1 was obtained.

Example 2

A visible light absorber-containing biaxially stretched PET film (substrate 2) having an undercoat layer on both main surfaces and having a thickness $D_1$ of 20 μm, and a touch sensor 2 of Example 2 having the substrate 2 were produced in the same manner as in Example 1 except that in the production of the substrate of Example 1, the mixing ratio between the pellets and the master pellets was adjusted to prepare a mixture B in which the content of titanium oxynitride with respect to the total mass of the mixture was 32 mass ppm, and an unstretched PET film having a thickness of about 0.2 mm was produced using the obtained mixture B.

Example 3

A visible light absorber-containing biaxially stretched PET film (substrate 3) having an undercoat layer on both main surfaces and having a thickness $D_1$ of 40 μm, and a touch sensor 3 of Example 3 having the substrate 3 were produced in the same manner as in Example 1 except that in the production of the substrate of Example 1, the mixing ratio between the pellets and the master pellets was adjusted to prepare a mixture C in which the content of titanium oxynitride with respect to the total mass of the mixture was 20 mass ppm, and an unstretched PET film having a thickness of about 0.4 mm was produced using the obtained mixture C.

Example 4

A visible light absorber-containing biaxially stretched PET film (substrate 4) having an undercoat layer on both main surfaces and having a thickness $D_1$ of 40 μm, and a touch sensor 4 of Example 4 having the substrate 4 were produced in the same manner as in Example 1 except that in the production of the substrate of Example 1, the mixing ratio between the pellets and the master pellets was adjusted to prepare a mixture D in which the content of titanium oxynitride with respect to the total mass of the mixture was 500 mass ppm, and an unstretched PET film having a thickness of about 0.4 mm was produced using the obtained mixture D.

Example 5

A visible light absorber-containing biaxially stretched PET film (substrate 5) having an undercoat layer on both main surfaces and having a thickness $D_1$ of 110 μm, and a touch sensor 5 of Example 5 having the substrate 5 were produced in the same manner as in Example 1 except that in the production of the substrate of Example 1, the mixing ratio between the pellets and the master pellets was adjusted to prepare a mixture E in which the content of titanium oxide with respect to the total mass of the mixture was 66 mass ppm, and an unstretched PET film having a thickness of about 1.4 mm was produced using the obtained mixture E.

Example 6

A visible light absorber-containing biaxially stretched PET film (substrate 6) having an undercoat layer on both main surfaces and having a thickness $D_1$ of 110 μm, and a touch sensor 6 of Example 6 having the substrate 6 were produced in the same manner as in Example 1 except that in the production of the substrate of Example 1, the mixing ratio between the pellets and the master pellets was adjusted to prepare a mixture F in which the content of titanium oxynitride with respect to the total mass of the mixture was 180 mass ppm, and an unstretched PET film having a thickness of about 1.4 mm was produced using the obtained mixture F.

Example 7

A visible light absorber-containing biaxially stretched PET film (substrate 7) having an undercoat layer on both main surfaces and having a thickness $D_1$ of 300 μm, and a touch sensor 7 of Example 7 having the substrate 7 were produced in the same manner as in Example 5 except that in the production of the substrate of Example 5, an unstretched PET film having a thickness of about 3.0 mm was produced by melting the mixture E at 280° C. and casting the melt on a metal drum.

Comparative Example 1

A biaxially stretched PET film (substrate C1) having an undercoat layer on both main surfaces and having a thickness $D_1$ of 40 μm, and a touch sensor C1 of Comparative Example 1 having the substrate C1 were obtained in the same manner as in Example 1 except that in the production of the substrate of Example 1, an unstretched PET film having a thickness of about 0.4 mm was produced using polyester-containing pellets not containing the visible light absorber (titanium oxynitride) produced in Example 1 in place of the mixture A.

Comparative Example 2

A visible light absorber-containing biaxially stretched PET film (substrate C2) having an undercoat layer on both main surfaces and having a thickness $D_1$ of 40 μm, and a touch sensor C2 of Comparative Example 2 having the substrate C2 were produced in the same manner as in Example 1 except that in the production of the substrate of Example 1, the mixing ratio between the pellets and the master pellets was adjusted to prepare a mixture X in which the content of titanium oxynitride with respect to the total mass of the mixture was 2 mass ppm, and an unstretched PET film having a thickness of about 0.4 mm was produced using the obtained mixture X.

Comparative Example 3

A visible light absorber-containing biaxially stretched PET film (substrate C3) having an undercoat layer on both main surfaces and having a thickness $D_1$ of 40 μm, and a touch sensor C3 of Comparative Example 3 having the substrate C3 were produced in the same manner as in Example 1 except that in the production of the substrate of Example 1, the mixing ratio between the pellets and the master pellets was adjusted to prepare a mixture Y in which the content of titanium oxynitride with respect to the total mass of the mixture was 700 mass ppm, and an unstretched PET film having a thickness of about 0.4 mm was produced using the obtained mixture Y.

Comparative Example 4

A visible light absorber-containing biaxially stretched PET film (substrate C4) having an undercoat layer on both main surfaces and having a thickness $D_1$ of 110 μm, and a touch sensor C4 of Comparative Example 4 having the substrate C4 were produced in the same manner as in Example 1 except that in the production of the substrate of Example 1, the mixing ratio between the pellets and the master pellets was adjusted to prepare a mixture Z in which the content of titanium oxynitride with respect to the total mass of the mixture was 250 mass ppm, and an unstretched PET film having a thickness of about 1.4 mm was produced using the obtained mixture Z.

Comparative Example 5

A visible light absorber-containing biaxially stretched PET film (substrate C5) having an undercoat layer on both main surfaces and having a thickness $D_1$ of 300 μm, and a touch sensor C5 of Comparative Example 5 having the substrate C5 were produced in the same manner as in Example 1 except that in the production of the substrate of Example 1, the mixing ratio between the pellets and the master pellets was adjusted to prepare a mixture C in which the content of titanium oxynitride with respect to the total mass of the mixture was 20 mass ppm, and an unstretched PET film having a thickness of about 3.0 mm was produced using the obtained mixture C.

[Measurement of Thickness of Substrate]

The thickness of the substrate obtained in each example was measured by the following procedure using a linear gauge (Separate-Type Gauge Head, High-Accuracy Linear Gage "LGH-1010C-B-EH" and Linear Gauge Counter "EH-10S", manufactured by Mitutoyo Corporation).

For the substrate of each example, the thickness was measured at arbitrarily selected nine places, and the arithmetic average value of the measured values at the nine places was defined as the thickness $D_1$ of the substrate.

[Measurement and Evaluation of Optical Performance of Substrate]

The optical performance of the substrate obtained in each example was measured by the following procedure using a spectrophotometer with an integrating sphere unit (ultraviolet-visible spectrophotometer "V-660", integrating sphere unit "ISV-722," manufactured by JASCO Corporation).

<1> Baseline Measurement

A Spectralon standard reflector (standard white plate with case 6916-H422A manufactured by JASCO Corporation) as a support white plate was placed in the reflectance measurement sample folder of the integrating sphere unit, and the visible light reflectance $\rho_0$ of the support white plate was obtained according to the method described in JIS R 3106:2019.

<2> Measurement of Sample Substrate

The substrate of each example and the support white plate whose visible light reflectance $\rho_0$ had been measured were laminated to produce a laminate. The produced laminate was placed in the reflectance measurement sample folder of the integrating sphere unit such that the measurement light was incident on the substrate, and the visible light reflectance $\rho_x$ of the laminate was obtained in the same manner as described above.

The internal absorbance $A_1$ of the substrate was calculated from the obtained visible light reflectance $\rho_0$ of the support white plate and the visible light reflectance $\rho_x$ of the laminate by formula (1) below. The parameter X (m$^{-1}$) was calculated from the calculated internal absorbance $A_1$ and the thickness $D_1$ (m) of the substrate by formula (2) below.

$$A_1 = -\log_{10}\{(\rho_x/\rho_0)^{0.5}\} \quad \text{Formula (1):}$$

$$X = A_1/D_1 \quad \text{Formula (2)}$$

Table 1 below shows the internal absorbance $A_1$ and the parameter X of each substrate.

[Evaluation]

(Preparation of Touch Panel for Evaluation)

In order to strictly compare samples while excluding the influence of individual differences of display elements, a simulated touch panel was produced by the following method.

—Production of Composite Member—

The following members including the touch sensor obtained in each of examples and comparative examples were bonded to each other to produce a composite member in which the respective members were disposed in the following order.

Glass substrate (thickness: 0.4 mm)
Transparent pressure sensitive adhesive layer (8146-3 manufactured by 3M Japan Limited, thickness: 75 μm)
Touch sensor
Transparent pressure sensitive adhesive layer (8146-6 manufactured by 3M Japan Limited, thickness: 150 μm)
Triacetyl cellulose (TAC) film (manufactured by FUJIFILM Corporation, thickness: 40 μm)

—Production of Simulated Panel—

Onto a display surface of a 14-inch organic EL panel (manufactured by Samsung Display Co., Ltd., model number "ATNA40CU03"), 0.7 mL of a matching oil (Newton ring inhibitor "HM-30" manufactured by Koyo Chemical Co., Ltd.) was dropped, and the composite member for evaluation was placed thereon such that the TAC film faces the organic EL panel and air does not enter, thus producing a simulated panel.

It was checked that evaluation values of the simulated panel roughly coincide with those of the actual touch panel product (for example, a touch panel or the like having a member configuration including a glass, a transparent pressure sensitive adhesive, a touch sensor, a transparent pressure sensitive adhesive, and an organic EL panel in this order) and there is no difference in rank order of evaluation, and then the following evaluation method was adopted as the evaluation method in the implementation form.

—Measurement of Black Display Brightness—

The simulated panel was installed in a dark room without windows such that the display surface faces vertically upward. A black ((R, G, B)=(0, 0, 0)) square image of 80 mm×80 mm was displayed at the screen center of the simulated panel, and a white ((R, G, B)=(255, 255, 255)) image was displayed over the entire region around the black display image. A cylinder (diameter: 60 mm, length: 350 mm) produced by rolling a black cardboard was set up vertically at the screen center of the simulated panel such that the center of the black display image of the simulated panel and the center axis of the cylinder substantially coincide with each other. A spectral radiance meter (CS-3000HDR manufactured by Konica Minolta, Inc.) was set at the tip of the cylinder, and the brightness of the image displayed on the simulated panel was measured under the following measurement conditions and defined as a black display brightness.

(Brightness Meter Measurement Conditions)
Speed mode: FAST
Dark setting: standard
Aperture angle: 1 deg —Measurement of White Display Brightness—

The brightness was measured in the same manner as in the measurement method for a black display brightness except that the image displayed on the simulated panel was an image that was entirely white ((R, G, B)=(255, 255, 255)), and the measured brightness was defined as a white display brightness.

It should be noted that when the brightness was measured in the same manner as described above except that an image obtained by inverting white and black of the image displayed in the measurement of the black display brightness was displayed, the obtained brightness value was the same as the white display brightness measured by displaying the white image on the entire surface.

The measurement results of the black display brightness and the white display brightness of the touch sensor produced in each of examples and comparative examples are shown in Table 1 below.

When the organic EL panel alone was measured without laminating the composite member, the black display brightness was 0.2 mCd/m$^2$, the white display brightness was 415 Cd/m$^2$, and the contrast ratio (the ratio of the white display brightness to the black display brightness) was 2,060,000.

(Evaluation of Contrast)

From the measurement results of the black display brightness and the white display brightness obtained above, the contrast between black display and white display when black and white display was made was evaluated.

Specifically, the ratio of the measurement value of the white display brightness to the measurement value of the black display brightness was calculated as a contrast ratio, and the contrast of each touch sensor was evaluated from the obtained contrast ratio based on the following criteria.

—Contrast Evaluation Criteria—

"A": The contrast ratio is 1,500,000 or more.
"B": The contrast ratio is 1,000,000 or more and less than 1,500,000.
"C": The contrast ratio is 500,000 or more and less than 1,000,000.
"D": The contrast ratio is less than 500,000.

(Evaluation of White Display Brightness)

From the measurement result of the white display brightness obtained above, the touch sensor's performance of preventing a decrease in white display brightness was evaluated.

Specifically, from the measurement result of the white display brightness of each simulated panel and the measurement result of the white display brightness when the organic EL panel was used alone, the loss rate of the white display brightness due to the touch sensor was calculated using the following formula, and from the obtained loss rate, the touch sensor's performance of preventing a decrease in white display brightness was evaluated based on the following criteria.

Loss rate of white display brightness(%)=(1−white display brightness of simulated panel/white display brightness of organic EL panel)×100

—Evaluation Criteria for Performance of Preventing Decrease in White Display Brightness—

"A": The loss rate of the white display brightness is 2% or less.
"B": The loss rate of the white display brightness is more than 2% and 4% or less.
"C": The loss rate of the white display brightness is more than 4% and 6% or less.
"D": The loss rate of the white display brightness is more than 6%.

The following table shows the performance of the substrate of each touch sensor, measurement results, and evaluation results.

The criteria for a touch sensor capable of realizing a high-brightness and high-contrast touch panel are as follows: if the evaluations are each any of A to C, it is an acceptable level, if the evaluations are each A or B, it is a good level, and if the evaluations are each A, it is an excellent level.

TABLE 1

| Table 1 | | | Example 1 | Example 2 | Example 3 | Example 4 | Example 5 | Example 6 | Example 7 |
|---|---|---|---|---|---|---|---|---|---|
| Substrate | No. | | 1 | 2 | 3 | 4 | 5 | 6 | 7 |
| | Content of visible light absorber (mass ppm) | | 50 | 32 | 20 | 500 | 66 | 180 | 66 |
| | Thickness $D_1$ (μm) | | 40 | 20 | 40 | 40 | 110 | 110 | 300 |
| | Internal absorbance $A_1$ | | 0.003 | 0.002 | 0.002 | 0.025 | 0.010 | 0.025 | 0.025 |
| | Parameter X ($m^{-1}$) | | 83 | 83 | 47 | 623 | 87 | 224 | 82 |
| Measurement of brightness | White display brightness ($Cd/m^2$) | | 412 | 413 | 413 | 392 | 406 | 392 | 392 |
| | Black display brightness ($mCd/m^2$) | | 0.3 | 0.2 | 0.6 | 0.2 | 0.6 | 0.3 | 0.7 |
| Evaluation | Contrast ratio | Value (×$10^4$) | 137 | 207 | 73 | 196 | 68 | 131 | 59 |
| | | Rating | B | A | C | A | A | B | C |
| | Decrease in white display brightness | Loss rate (%) | 0.7 | 0.5 | 0.5 | 5.5 | 2.2 | 5.5 | 5.5 |
| | | Rating | A | A | A | C | B | C | C |

TABLE 2

| Table 2 | | | Comparative Example 1 | Comparative Example 2 | Comparative Example 3 | Comparative Example 4 | Comparative Example 5 |
|---|---|---|---|---|---|---|---|
| Substrate | No. | | C1 | C2 | C3 | C4 | C5 |
| | Content of visible light absorber (mass ppm) | | — | 2 | 700 | 250 | 20 |
| | Thickness D1 (μm) | | 40 | 40 | 40 | 110 | 300 |
| | Internal absorbance $A_1$ | | 0.001 | 0.001 | 0.035 | 0.034 | 0.008 |
| | Parameter X ($m^{-1}$) | | 23 | 25 | 863 | 308 | 27 |
| Measurement of brightness | White display brightness ($Cd/m^2$) | | 415 | 414 | 383 | 384 | 407 |
| | Black display brightness ($mCd/m^2$) | | 2.6 | 2.2 | 0.2 | 0.3 | 2.3 |
| Evaluation | Contrast ratio | Value (×$10^4$) | 16 | 19 | 192 | 154 | 18 |
| | | Rating | D | D | A | A | D |
| | Decrease in white display brightness | Loss rate (%) | 0.0 | 0.2 | 7.7 | 7.5 | 1.9 |
| | | Rating | A | A | D | D | B |

The results in Table 1 verify that the touch sensors of the present invention of Examples 1 to 7 are excellent in contrast between black display and white display and excellent in performance of suppressing a decrease in brightness of white display when the touch sensor is applied to a display device and black and white display is made.

Meanwhile, in the case of the touch sensors of Comparative Examples 1, 2, and 5 in which the parameter X is less than 30 m-1, while white display brightness was maintained high, the improvement of the contrast was insufficient.

In addition, in the case of the touch sensors of Comparative Examples 3 and 4 in which the internal absorbance $A_1$ is more than 0.03, the loss of white display brightness was large, and the performance of suppressing a decrease in brightness was insufficient.

The comparison of Examples 1, 2, and 5 verifies that even when the parameter X is equivalent, the contrast between black display and white display when black and white display is made is more excellent with smaller thickness of the substrate.

In addition, the comparison of Examples 4, 6, and 7 verifies that even when the internal absorbance $A_1$ is equivalent, the contrast between black display and white display when black and white display is made is more excellent with smaller thickness of the substrate.

These comparisons verify that when the thickness of the substrate is less than 110 μm, the contrast between black display and white display when black and white display is made is more excellent while the loss of white display remains less.

What is claimed is:

1. A touch sensor comprising:
   a substrate; and
   a sensing electrode disposed on at least one surface side of the substrate,
   wherein the substrate includes a visible light absorber, and the substrate has an internal absorbance $A_1$ of 0.0004 to 0.03 and a parameter X of 30 to 3000 $m^{-1}$, the internal absorbance $A_1$ and the parameter X being calculated with Test X:
   Test X: a visible light reflectance $\rho_0$ of a support white plate is obtained by a method described in JIS R 3106:2019; measurement light is made incident on a laminate formed by laminating the support white plate and the substrate on the substrate side of the laminate to obtain a visible light reflectance $\rho_x$ by the method described in JIS R 3106:2019; the internal absorbance $A_1$ of the substrate is calculated from the visible light reflectance $\rho_0$ and the visible light reflectance $\rho_x$ by formula (1) below; and the parameter X ($m^{-1}$) is calculated from the calculated internal absorbance $A_1$ and a thickness $D_1$ (m) of the substrate by formula (2) below:

$$A_1 = -\log_{10}\{(\rho_x/\rho_0)^{0.5}\} \quad \text{Formula (1)}$$

$$X = A_1/D_1. \quad \text{Formula (2)}$$

2. The touch sensor according to claim 1,
   wherein the substrate has a thickness of 10 to 110 μm.
3. The touch sensor according to claim 1,
   wherein the visible light absorber is a black pigment, and a content of the black pigment is 10 to 500 mass ppm with respect to a total mass of the substrate.
4. The touch sensor according to claim 1,
   wherein the substrate has a thickness of 10 to 110 μm, the visible light absorber is a black pigment, and a content of the black pigment is 10 to 500 mass ppm with respect to a total mass of the substrate.
5. A touch panel comprising the touch sensor according to claim 4.
6. An image display device comprising:
   an image display element; and
   the touch sensor according to claim 4.
7. The image display device according to claim 6 further comprising a pressure sensitive adhesive layer,
   wherein the image display element, the pressure sensitive adhesive layer, and the touch sensor are disposed in this order.
8. The image display device according to claim 7,
   wherein the image display element is an organic electroluminescence display element.
9. The image display device according to claim 6,
   wherein the image display element is an organic electroluminescence display element.
10. A touch panel comprising the touch sensor according to claim 1.
11. An image display device comprising:
    an image display element; and
    the touch sensor according to claim 1.
12. The image display device according to claim 11 further comprising a pressure sensitive adhesive layer,
    wherein the image display element, the pressure sensitive adhesive layer, and the touch sensor are disposed in this order.
13. The image display device according to claim 12,
    wherein the image display element is an organic electroluminescence display element.
14. The image display device according to claim 11,
    wherein the image display element is an organic electroluminescence display element.

* * * * *